(12) United States Patent
Ghosh et al.

(10) Patent No.: US 6,649,436 B2
(45) Date of Patent: Nov. 18, 2003

(54) USING ORGANIC MATERIALS IN MAKING AN ORGANIC LIGHT-EMITTING DEVICE

(75) Inventors: Syamal K. Ghosh, Rochester, NY (US); Donn B. Carlton, Hamlin, NY (US); Tukaram K. Hatwar, Penfield, NY (US); Steven A. Van Slyke, Pittsford, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/073,690

(22) Filed: Feb. 11, 2002

(65) Prior Publication Data

US 2003/0153109 A1 Aug. 14, 2003

(51) Int. Cl.[7] .............................................. H01L 21/00
(52) U.S. Cl. ......................................... 438/29; 430/200
(58) Field of Search .............................. 438/22, 29, 99, 438/758, 761, 780; 257/40, 82, 103; 430/200–201, 312, 319, 964

(56) References Cited

U.S. PATENT DOCUMENTS

| | | | |
|---|---|---|---|
| 4,356,429 A | 10/1982 | Tang | |
| 4,539,507 A | 9/1985 | VanSlyke et al. | |
| 4,720,432 A | 1/1988 | VanSlyke et al. | |
| 4,769,292 A | 9/1988 | Tang et al. | |
| 5,294,870 A | 3/1994 | Tang et al. | |
| 5,550,066 A | 8/1996 | Tang et al. | |
| 5,946,550 A | * 8/1999 | Papadimitrakopoulos | .... 438/99 |
| 6,114,088 A | * 9/2000 | Wolk et al. | .............. 430/273.1 |
| 6,558,735 B2 | * 5/2003 | Marcus et al. | ................. 427/9 |

* cited by examiner

Primary Examiner—David Nelms
Assistant Examiner—David Vu
(74) Attorney, Agent, or Firm—Raymond L. Owens

(57) ABSTRACT

A method of making an organic layer from an organic material on a substrate which will form part of an organic light-emitting device, including the steps of providing a sublimable organic material in a powder form; providing a thermally conductive and non-sublimable ceramic material in a powder form; forming a mixture of the sublimable organic material powder and thermally conductive and non-sublimable ceramic material powder; placing such mixture into a die and using a punch to apply sufficient pressure to the heated mixture to cause the mixture of powders to consolidate into a solid pellet; and removing the pellet from the die.

25 Claims, 10 Drawing Sheets

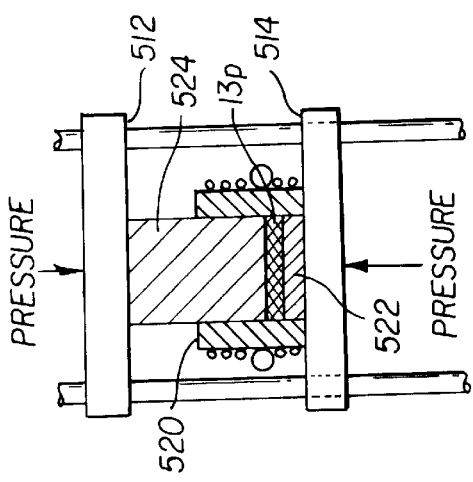
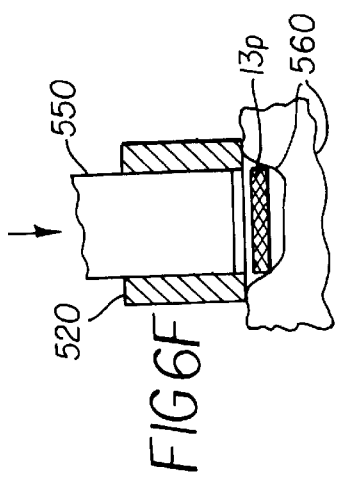
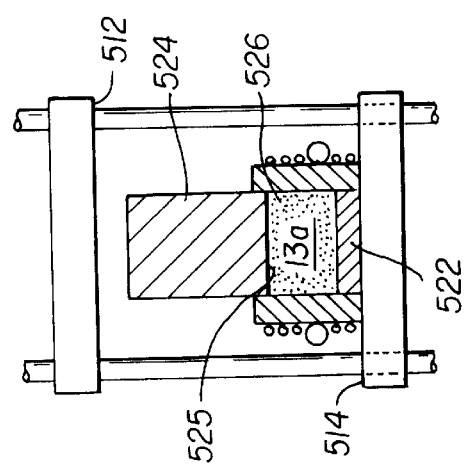
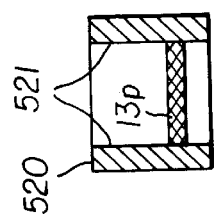
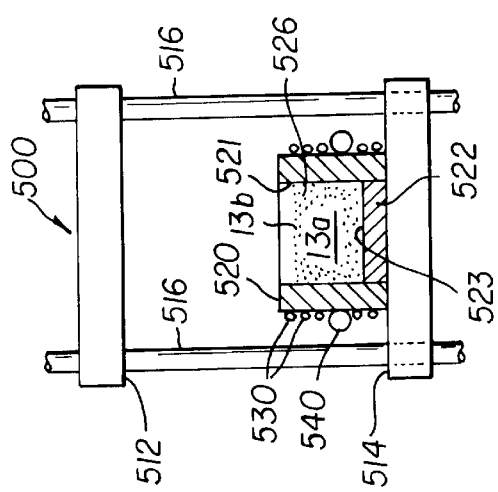
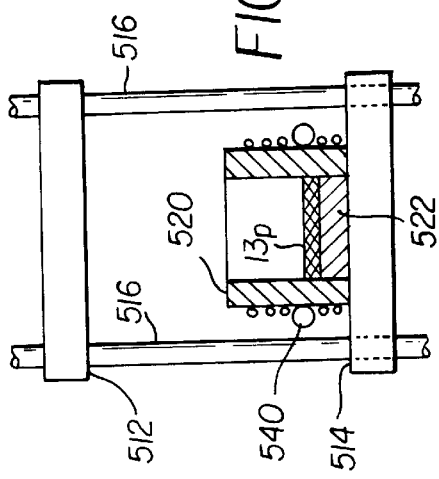

USING ORGANIC MATERIALS IN MAKING AN ORGANIC LIGHT-EMITTING DEVICE

CROSS REFERENCE TO RELATED APPLICATION

Reference is made to commonly assigned U.S. patent application Ser. No. 09/898,369 filed Jul. 3, 2001, entitled "Method of Handling Organic Material in Making An Organic Light-Emitting Device" by Van Slyke et al, the teachings of which are incorporated herein.

FIELD OF THE INVENTION

The present invention relates generally to a method of making an organic light-emitting device (OLED) and particularly to an improved method of forming solid pellets from powders of organic materials and using such pellets in physical vapor deposition to make an organic layer on a substrate which will form part of an OLED.

BACKGROUND OF THE INVENTION

An organic light-emitting device, also referred to as an organic electroluminescent (EL) device, can be constructed by sandwiching two or more organic layers between first and second electrodes.

In a passive matrix OLED of conventional construction, a plurality of laterally spaced light-transmissive anodes, for example indium-tin-oxide (ITO) anodes, are formed as first electrodes on a light-transmissive substrate such as, for example, a glass substrate. Two or more organic layers are then formed successively by physical vapor deposition of respective organic materials from respective sources, within a chamber held at reduced pressure, typically less than $10^{-3}$ Torr. A plurality of laterally spaced cathodes are deposited as second electrodes over an uppermost one of the organic layers. The cathodes are oriented at an angle, typically at a right angle, with respect to the anodes.

Such conventional passive matrix organic light-emitting devices are operated by applying an electrical potential (also referred to as a drive voltage) between appropriate columns (anodes) and, sequentially, each row (cathode). When a cathode is biased negatively with respect to an anode, light is emitted from a pixel defined by an overlap area of the cathode and the anode, and emitted light reaches an observer through the anode and the substrate.

In an active matrix organic light-emitting device (OLED), an array of anodes are provided as first electrodes by thin-film transistors (TFTs) which are connected to a respective light-transmissive portion. Two or more organic layers are formed successively by vapor deposition in a manner substantially equivalent to the construction of the aforementioned passive matrix device. A common cathode is deposited as a second electrode over an uppermost one of the organic layers. The construction and function of an active matrix organic light-emitting device is described in commonly-assigned U.S. Pat. No. 5,550,066, the disclosure of which is herein incorporated by reference.

Organic materials, thicknesses of vapor-deposited organic layers, and layer configurations, useful in constructing an organic light-emitting device, are described, for example, in commonly-assigned U.S. Pat. Nos. 4,356,429; 4,539,507; 4,720,432; and 4,769,292, the disclosures of which are herein incorporated by reference.

Organic materials useful in making OLEDs, for example organic hole-transporting materials, organic light-emitting materials predoped with an organic dopant, and organic electron-transporting materials can have relatively complex molecular substrates with relatively weak molecular bonding forces, so that care must be taken to avoid decomposition of the organic material(s) during physical vapor deposition.

The aforementioned organic materials are synthesized to a relatively high degree of purity, and are provided in the form of powders, flakes, or granules. Such powders or flakes have been used heretofore for placement into a physical vapor deposition source wherein heat is applied for forming a vapor by sublimation or vaporization of the organic material, the vapor condensing on a substrate to provide an organic layer thereon.

Several problems have been observed in using organic powders, flakes, or granules in physical vapor deposition:

(i) powders, flakes, or granules are difficult to handle because they can acquire electrostatic charges via a process referred to as triboelectric charging;

(ii) powders, flakes, or granules of organic materials generally have a relatively low physical density (expressed in terms of weight per unit volume) in a range from about 0.05 to about 0.2 $g/cm^3$, compared to a physical density of an idealized solid organic material of about 1 $g/cm^3$;

(iii) powders, flakes, or granules of organic materials have an undesirably low thermal conductivity, particularly when placed in a physical vapor deposition source which is disposed in a chamber evacuated to a reduced pressure as low as $10^{-6}$ Torr. Consequently, powder particles, flakes, or granules are heated only by radiative heating from a heated source, and by conductive heating of particles or flakes directly in contact with heated surfaces of the source. Powder particles, flakes, or granules which are not in contact with heated surfaces of the source are not effectively heated by conductive heating due to a relatively low particle-to-particle contact area; and (iv) powders, flakes, or granules can have a relatively high ratio of surface area to volume of such particles and a correspondingly high propensity to entrap air and/or moisture between particles under ambient conditions. Consequently, a charge of organic powders, flakes, or granules loaded into a physical vapor deposition source which is disposed in a chamber must be thoroughly outgased by preheating the source once the chamber has been evacuated to a reduced pressure. If outgasing is omitted or is incomplete, particles can be ejected from the source together with a vapor stream during physical vapor-depositing an organic layer on a substrate. An OLED, having multiple organic layers, can be or can become functionally inoperative if such layers include particles or particulates.

Each one, or a combination, of the aforementioned aspects of organic powders, flakes, or granules can lead to nonuniform heating of such organic materials in physical vapor deposition sources with attendant spatially nonuniform sublimation or vaporization of organic material and can, therefore, result in potentially nonuniform vapor-deposited organic layers formed on a substrate.

SUMMARY OF THE INVENTION

It is an object of the present invention to provide a method of handling organic material adaptable for making an organic layer on a substrate which will form part of an OLED.

It is another object of the present invention to provide a method of consolidating organic powder into a solid pellet.

It is a further object of the invention to provide a method of making an organic layer from a solid pellet of organic material and on a substrate which will form part of an OLED.

It is still a further object of the present invention to provide a method of consolidating into a solid pellet a mixture of a sublimable organic material powder and a thermally conductive non-sublimable ceramic powder.

In one aspect, the present invention provides a method of making an organic layer from an organic material on a substrate which will form part of an OLED, comprising the steps of:

(a) providing a sublimable organic material in a powder form;

(b) providing a thermally conductive and non-sublimable ceramic material in a powder form;

(c) forming a mixture of the sublimable organic material powder and thermally conductive and non-sublimable ceramic material powder;

(d) placing such mixture into a die and using two punches, a lower and an upper punch, to apply sufficient pressure to the mixture to cause the mixture of powders to consolidate into a solid pellet;

(e) applying heat to the die during or prior to applying pressure by the opposing punches to aid in causing the mixture of powders to consolidate into a solid pellet; and (f) removing the pellet from the die.

In another aspect, the present invention provides a method of using the solid pellet formed for making a layer of organic material for an OLED device comprising the steps of:

(a) placing the solid pellet into a physical vapor deposition source disposed in a chamber;

(b) positioning the substrate in the chamber and in a spaced relationship with respect to the source;

(c) evacuating the chamber to a reduced pressure; and (d) applying heat to the source to cause at least a portion of the organic material in the pellet to sublime while the thermally conductive ceramic material remains unsublimed to provide a vapor of the organic material which forms the organic layer on the substrate.

A feature of the present invention is that the method of consolidating organic powder into a solid pellet can be accomplished with relatively simple tools and at a location remote from a location of use of such pellet in a physical vapor deposition apparatus.

Another feature of the present invention is that the method of consolidating organic powder into a solid pellet substantially facilitates handling, transfer or shipping of organic material in and between different locations.

Another feature of the present invention is that a plurality of pellets of organic material, prepared by the method of the present invention, can be handled, transferred or shipped in a container having a significantly reduced volume with respect to a container for handling, transferring or shipping organic material in powder form and of comparable weight.

Another feature of the present invention is that a solid pellet of an OLED-material can be made by the method of the present invention wherein a powder of at least one OLED host-material and a powder of at least one organic dopant material are mixed or blended to provide a mixture prior to consolidating the mixture into a solid pellet.

Another feature of the present invention is that the method of consolidating powder into a solid pellet and the method of making an organic layer on a substrate by evaporating a portion of a solid pellet in a physical vapor deposition source substantially eliminates ejection of powder particles from the source and, accordingly, provides an organic layer substantially free from particulate inclusions.

Another feature of the present invention is that the method of consolidating powder into a solid pellet can be tailored to provide a pellet having a shape selected to conform with a shape of a physical vapor deposition source from which a portion of a pellet is evaporated to form an organic layer on a substrate.

Another feature of the present invention is that the homogeneous dispersion of thermally conductive ceramic powder in otherwise thermally non-conductive solid organic pellets helps the consolidation process and also thermal evaporation by means of distributing heat uniformly throughout the solid pellets.

Another important feature of the present invention is that the thermally conductive ceramic powder does not interfere or contaminate the thermally evaporated organic molecules.

BRIEF DESCRIPTION OF THE DRAWINGS

FIGS. 6A–6F schematically indicate a sequence of process steps for forming a solid pellet from a mixture of organic and ceramic powders in a die disposed in a uniaxial press in accordance with the present invention, wherein:

FIG. 6A shows the die having organic and ceramic powder mixture filled inside a die cavity over a lower punch;

FIG. 6B shows an upper punch positioned into the die cavity and contacting an upper surface of the powder material;

FIG. 6C shows pressure being applied by the uniaxial press to the upper and lower punches to cause the organic and ceramic powder mixture material to consolidate into a solid pellet;

FIG. 6D shows the upper punch removed from the die cavity;

FIG. 6E shows the die removed from the press and the lower punch removed from the die cavity, with the pellet shown clinging to side surfaces of the die cavity; and FIG. 6F depicts a pellet plunger useful for removing the pellet from the die and capturing the pellet in a compliant container;

FIGS. 7A–7E are illustrative examples of shapes of solid pellets which can be formed in the press of FIGS. 6A–6D by selecting desired dies and corresponding lower and upper punches, wherein:

FIG. 7A depicts a cylindrical pellet having two co-planar major surfaces;

FIG. 7B shows a circular pellet having one planar major surface and one opposing convex major surface;

FIG. 7C shows a circular pellet having two convex major surfaces;

FIG. 7D shows an elongated pellet having two co-planar major surfaces; and

FIG. 7E depicts an elongated pellet having one planar major surface and one opposing convex major surface;

The terms "powder" and "in the form of a powder" are used herein to denote a quantity of individual particles which can be flakes, granules, or mixtures of varied particle shapes.

DETAILED DESCRIPTION OF THE INVENTION

Figure 1:
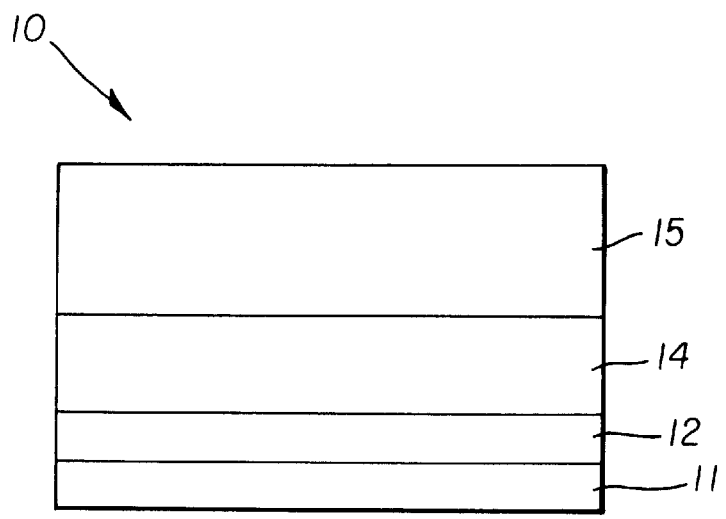
FIG. 1 depicts an OLED of the prior art.

The emission layer (EML) of an OLED includes an organic or organometallic material that produces light, known as electroluminescence, as a result of electron-hole recombination in the layer. Hereinafter, the term "organic" will be taken to include both purely organic and organometallic materials. In the simplest construction of the prior art, shown in FIG. 1, an emission layer 14 is sandwiched between an anode 12 and a cathode 15. The emission layer 14 can be a single pure material with a high luminescent efficiency. A well-known material for this purpose is tris(8-quinolinolato-N1,O8)aluminum (Alq), which produces excellent green electroluminescence. The emission layer 14 can also contain lesser amounts of other materials, conventionally called dopants, whose function is to alter the electroluminescence (EL) efficiency or the color of the emitted light. A substrate 11 provides mechanical support for an OLED 10 and for electrical leads connecting the OLED to a source of electrical current. Layers 12 through 15 together with the substrate 11 comprise the OLED 10. The cathode 15, or both the anode 12 and the substrate 11, are transparent to the electroluminescent light, allowing that light to be viewed. The term "transparent" refers to the ability to transmit no less than 80 percent of the electroluminescent light. In a variant of this substrate, the cathode, rather than the anode, rests upon the substrate. In that variant, either the anode, or both the cathode and the support, are transparent to the electroluminescent light. When the cathode and anode are connected to a source of electrical current (not shown), holes are injected from the anode and electrons are injected from the cathode, and they recombine in the emission layer to produce electroluminescent light.

Figure 2:
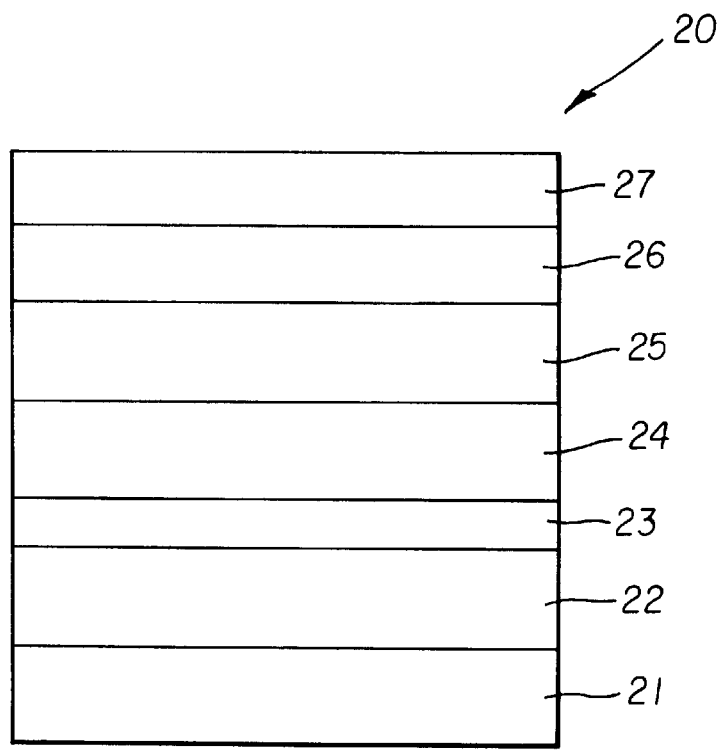
FIG. 2 depicts another OLED of the prior art.

In a more detailed OLED 20, shown in FIG. 2, an emission layer (EML) 25 is situated between a hole-transport layer 24 and an electron-transport layer 26. Each of these layers is composed predominantly of organic materials. The two transport layers deliver holes from an anode 22 and electrons from a cathode 27, respectively, to the emission layer 25. An optional hole-injection layer 23 facilitates the injection of holes from the anode 22 to the hole-transport layer 24. The emission layer 25 functions as the primary site for electron-hole recombination and emission of the resulting electroluminescent light. In this respect, the functions of the individual organic layers are distinct and can therefore be optimized independently. Thus, the emission layer 25 can be optimized for a desirable EL color and high luminance efficiency. The emission layer 25 can also contain lesser amount dopants whose function is to alter the EL efficiency or the color of the emitted light. Likewise, the hole- and electron-transport layers 24 and 26, respectively, can be optimized for their charge-transport properties. A substrate 21 provides mechanical support for the OLED 20 and for electrical leads connecting the OLED 20 to a source of electrical current. Layers 22 through 27 together along with the substrate 21 comprise the OLED 20. Either the cathode, or both the anode and the substrate, are transparent to the electroluminescent light. In a variant of this substrate, the cathode, rather than the anode, rests upon the substrate. In that variant, either the anode, or both the cathode and the support, are transparent to the electroluminescent light. In another variant of this substrate, the emission layer and the electron-transport layer can be combined to form a single layer that performs the functions of both. Yet, in another variant of this substrate, it is possible for the hole-transport layer to comprise at least two sublayers of different compositions, chosen to optimize separately the charge-injecting interface at the anode and the current-carrying properties of the remainder of the hole-transport layer.

When an electrical potential difference (not shown) is applied between the anode 22 and the cathode 27, the cathode 27 injects electrons into the electron-transport layer 26, and they migrate across that layer to the emission layer 25. At the same time, holes are injected from the anode 22 into the hole-transport layer 24, and they migrate across that layer to the emission layer 25. The holes and electrons recombine in the emission layer 25, frequently near the junction between the hole-transport layer 24 and the emission layer 25. Part of the energy released by the recombination process is emitted as electroluminescence, which escapes through the transparent anode or cathode and/or the substrate.

Figure 3:
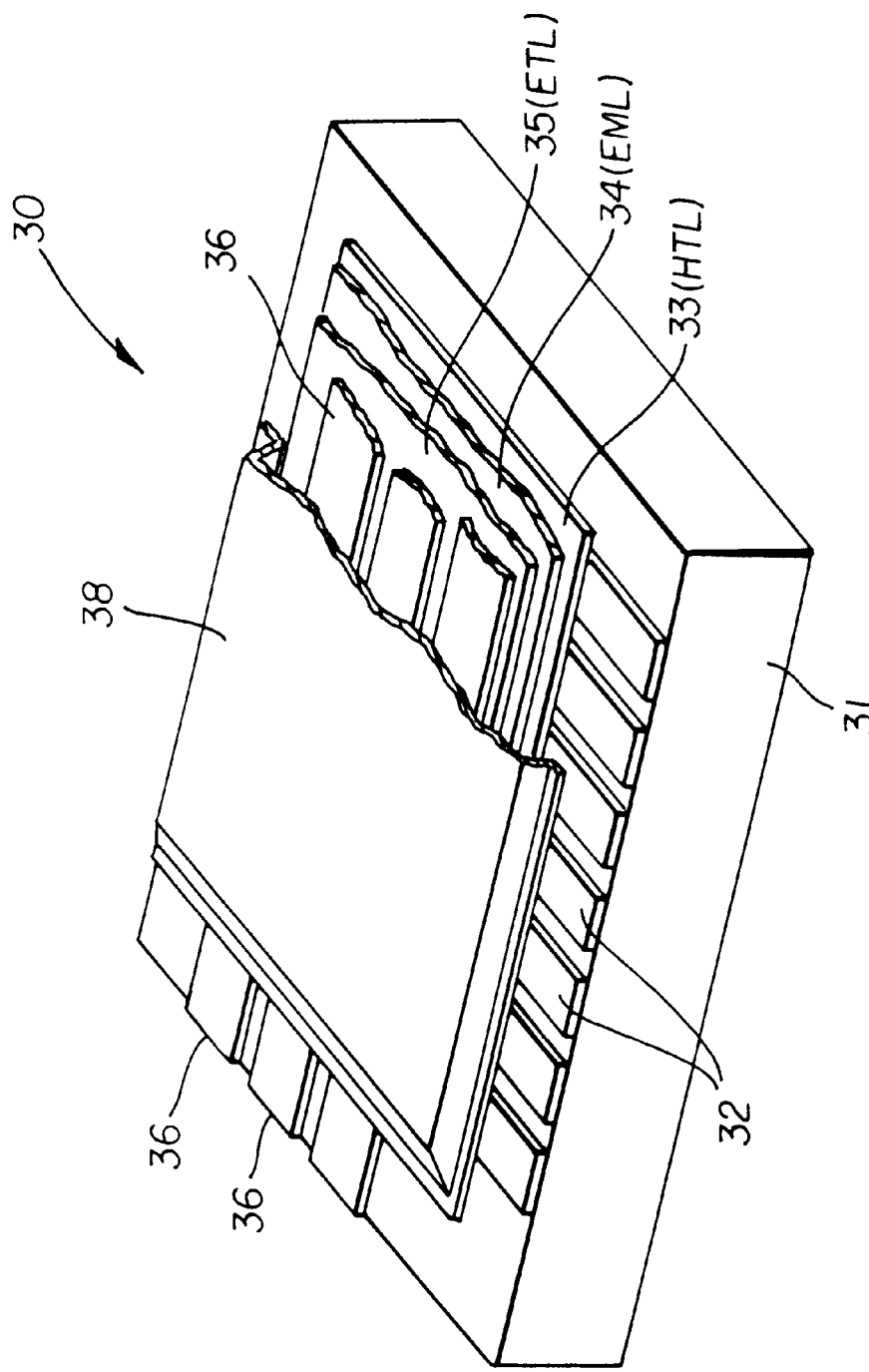
FIG. 3 is a schematic perspective of a passive matrix OLED having partially peeled-back elements to reveal various layers.

Turning to FIG. 3, a schematic perspective of a passive matrix OLED 30 is shown having partially peeled-back elements to reveal various layers. A light-transmissive substrate 31 has formed thereon a plurality of laterally spaced first anodes 32. An organic hole-transporting layer (HTL) 33, an organic emission layer (EML) 34, and an organic electron-transporting layer (ETL) 35 are formed in sequence by a physical vapor deposition process, as will be described in more details hereinafter. A plurality of laterally cathodes 36 are formed over the organic electron-transporting layer 35, and in a direction substantially perpendicular to the first anodes 32. An encapsulation or cover 38 seals environmentally sensitive portions of the substrate, thereby providing a completed OLED 30.

Figure 4:
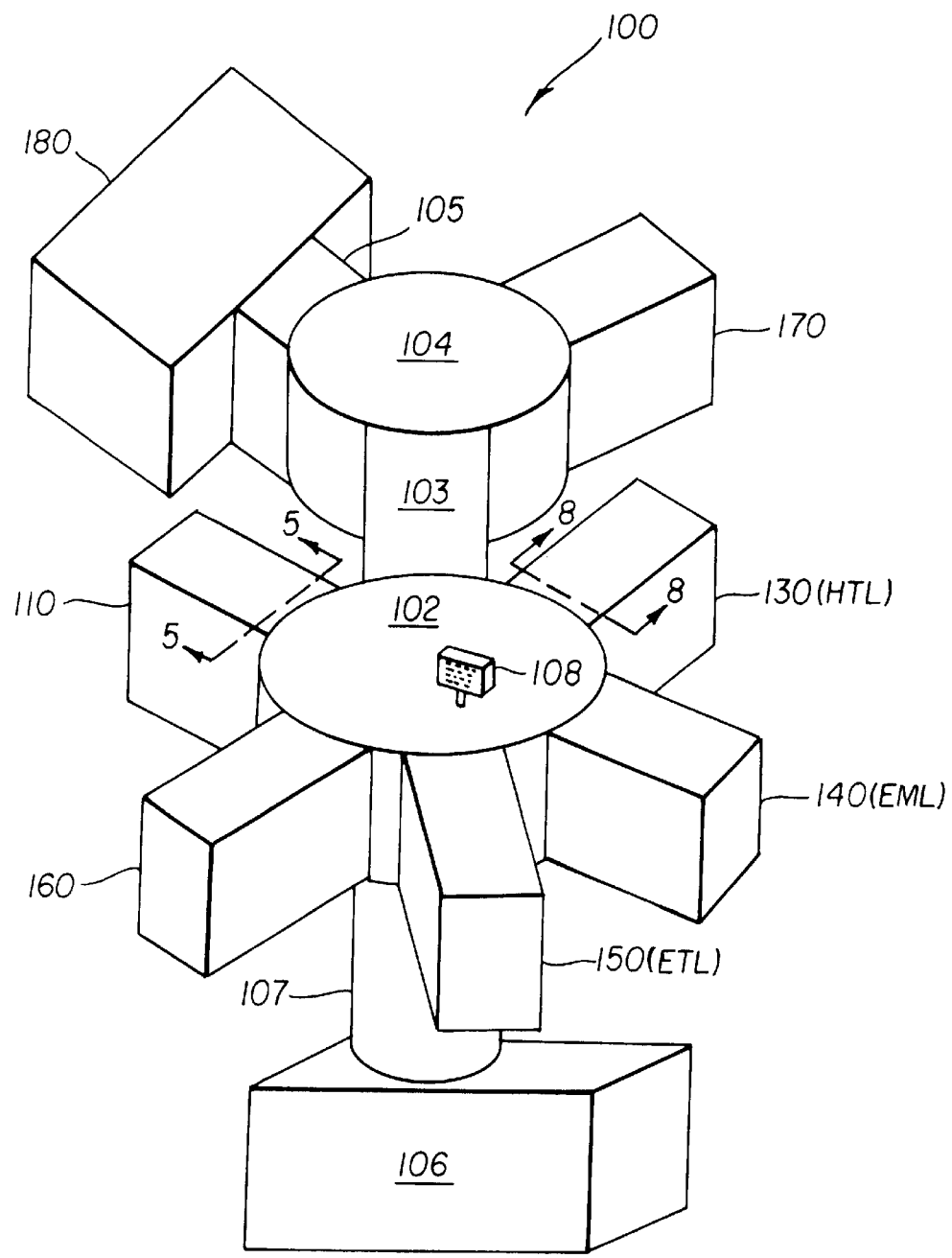
FIG. 4 is a schematic perspective of an apparatus suitable for making a relatively large number of OLEDs and having a plurality of stations extending from hubs.

Turning to FIG. 4, a schematic perspective of a system 100 is shown which is suitable for making a relatively large number of organic light-emitting devices using automated or robotic means (not shown) for transporting or transferring substrates or substrates among a plurality of stations extending from a buffer hub 102 and from a transfer hub 104. A vacuum pump 106 via a pumping port 107 provides reduced pressure within the hubs 102 and 104, and within each of the stations extending from these hubs. A pressure gauge 108 indicates the reduced pressure within the system 100. The pressure can be in a range from about $10^{-3}$ to $10^{-6}$ Torr.

The stations include a load station 110 for providing a load of substrates, a vapor deposition station 130 dedicated to forming organic hole-transporting layers (HTL), a vapor deposition station 140 dedicated to forming organic light-emitting layers (LEL), a vapor deposition station 150 dedicated to forming organic electron-transporting layers (ETL), a vapor deposition station 160 dedicated to forming the plurality of second electrodes (cathodes), an unload station 103 for transferring substrates from the buffer hub 102 to the transfer hub 104 which, in turn, provides a storage station 170, and an encapsulation station 180 connected to the hub 104 via a connector port 105. Each of these stations has an open port extending into the hubs 102 and 104, respectively, and each station has a vacuum-sealed access port (not shown) to provide access to a station for cleaning, replenishing materials, and for replacement or repair of parts. Each station includes a housing which defines a chamber.

Figure 5:
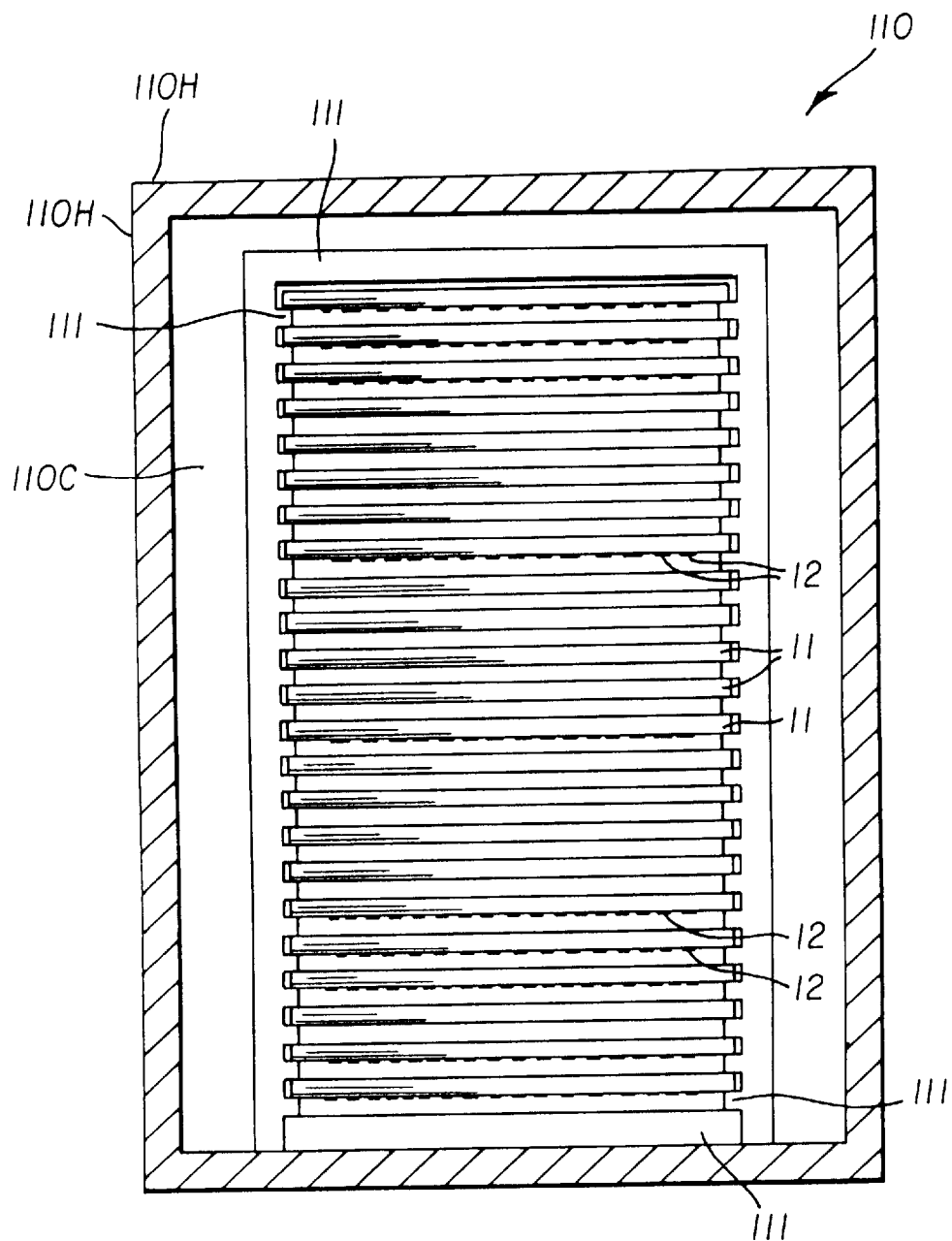
FIG. 5 is a schematic sectional view of a carrier containing a relatively large number of substrates, and positioned in a load station of the system of FIG. 4 as indicated by section lines 5—5 in FIG. 4.

FIG. 5 is a schematic sectional view of the load station 110, taken along section lines 5—5 of FIG. 4. The load station 110 has a housing 110H which defines a chamber 10C. Within the chamber 110C is positioned a carrier 111 designed to carry a plurality of substrates 31 having preformed first electrodes 32 (see FIG. 3). An alternative carrier 111 can be provided for supporting a plurality of active matrix substrates. Carriers 111 can also be provided in the unload station 103 and in the storage station 170.

Turning to FIGS. 6A–6F, a sequence of process steps is indicated schematically for forming a solid pellet 13p of organic hole-transporting material (NPB) and organic host for emission material (Alq) by consolidating a powder of organic hole-transporting material or emission material 13a in a die cavity 526 which is positioned in a uniaxial press 500. The uniaxial press 500 includes a fixed platform 512 and a movable platform 514 mounted on posts 516. Movable platform 514 can be driven by hydraulic means or a combination of hydraulic and air or mechanical means (not shown) and supports the die 520 and a lower punch 522.

In FIG. 6A, powder, flakes, particulates or granules of organic hole-transporting material or organic emission material 13a is filled in the die cavity 526 to a level 13b over the lower punch 522. Heating coils 530 can heat the die 520 from an ambient temperature of about 20° C. to a temperature of about 300° C., and at least one cooling coil 540 can cool a heated die relatively rapidly, for example from a temperature of 300° C. to a temperature of 50° C. or to an ambient temperature. The die 520 can also be heated inductively.

In FIG. 6B, an upper punch 524 is positioned in the die cavity 526 to contact an upper surface (the fill-level 13b) of the organic powder 13a.

The interior surface 521 of the die 520 is a polished surface, and at least the surface 523 of the lower punch 522 and the surface 525 of the upper punch 524 are polished surfaces. Taken together, the die and the lower and upper punches are also referred to as a die in portions of this disclosure.

In FIG. 6C, the movable platform 514 is shown driven upwardly in a direction towards the fixed platform 512, and pressure is applied by the upper and lower punches 524, 522 respectively. A uniaxial press 500, which applies pressure in only one direction, acts on the upper punch 524 and lower punch 522 so that such upper and lower punches (524 and 522, respectively) together apply pressure to cause the organic powder material 13a in the die 526 to consolidate into a solid pellet 13p. Compaction pressure applied by the uniaxial press 500 varied between 2,000 and 15,000 psi, more preferably between 4,000 and 10,000 psi to obtain high density solid pellets. The punches preposition inside the die to form a cavity predetermined to contain the correct volume of OLED powder to achieve the required solid dimension after consolidation.

In FIG. 6D, the movable platform 514 has been lowered and the upper punch 524 has been removed from the die 520. The die 520 can be heated during or prior to applying pressure by the opposing punches 524, 522. This is true so long as the heated mixture of particles aids in causing the mixture of powders to consolidate into a solid pellet. If the die 520 was heated prior to or during formation of the solid pellet 13p, the upper punch 524 is removed from the die upon cooling to a temperature in a range from 20° C. to 80° C. via the at least one cooling coil 540.

In FIG. 6E the die 520 is shown removed from the uniaxial press 500, and the lower punch 522 is removed from the die 520. For illustrative purposes only, the organic solid pellet 13p depicted clinging to the interior surface 521 of the die 520.

In FIG. 6F, a pellet plunger 550 is used for removing the solid pellet 13p from the die 520. The solid pellet 13p is captured in a compliant container 560 to minimize damage to the solid pellet 13p.

Heating the die 520 prior to or during application of pressure in the uniaxial press 500 can provide increased densification of a solid pellet 13p during a shortened interval of pressure application or, alternatively, at a lower pressure. A preferred range of die temperature extends from 50° C. to 300° C. The die temperature is generally maintained below the glass transition temperature, Tg, of the organic materials which will form the solid pellet 13p. The die 520 is cooled to a preferred temperature in a range from 80° C. to 20° C. prior to removing the solid pellet 13p from the die 520 and preferably prior to removing the upper punch 524 from the die 520.

The term "powder" includes fine grains of material, flakes, particulates or granules of organic hole-transporting material 13a can include a mixture comprising one or more hole-transporting host materials and one or more organic dopant materials. A solid pellet 13p from such a mixture can be placed into a physical vapor deposition source for making a doped organic hole-transporting layer 13 on a substrate. Such doped layer or sub-layer has been shown to provide enhanced operational stability of light-emission of an OLED, as disclosed in commonly assigned U.S. patent application Ser. No. 09/875,646, filed on Jun. 6, 2001 entitled "Organic Light-Emitting Device Having a Color-Neutral Dopant in a Hole-Transport Layer and/or in an Electron-Transport Layer", the disclosure of which is herein incorporated by reference.

Dopants which are effective in providing a vapor-deposited doped organic light-emitting layer on a substrate have been disclosed in commonly assigned U.S. Pat. Nos. 4,769,292 and 5,294,870.

Predoped organic light-emitting materials, and doped organic light-emitting layers formed therefrom by vapor deposition, have been disclosed in commonly assigned U.S. patent application Ser. No. 09/574,949, filed May 19, 2000 entitled "Predoped Materials for Making an Organic Light-Emitting Device", the disclosure of which is herein incorporated by reference.

A removable shroud (not shown) can be used to surround the lower punch 522, the die 520, and at least a portion of the upper punch 524. The shroud, and thus the elements enclosed by it, can be evacuated to a reduced pressure. Alternatively, an inert gas can be introduced into the shroud to provide an inert, i.e., a chemically non-reactive, atmosphere within the shroud so that the organic powder (e.g., 13a) and the solid pellet (e.g. 13p) formed therefrom are protected from decomposition in cases where the die 520 is heated to a temperature of up to 300° C. This is also helpful for organic powders which are very susceptible to moisture because it can be trapped inside the pellet 13p during the consolidation process.

The punch surfaces 523 and 525 can be planar surfaces. Alternatively, the surface 523 of the lower punch 522, or the surface 525 of the upper punch 524 can be a concave surface, or both surfaces 523 and 525 can have a concave shape, so that a solid pellet will have, respectively, co-planar major surfaces, one planar major surface and one convex major surface, or two convex major surfaces.

FIGS. 7A–7E are illustrative examples of shapes of solid pellets of organic materials which can be readily formed in the uniaxial press 500 of FIGS. 6A–6D by selecting dies 520 and corresponding upper and lower punches 524 and 522, respectively.

Figure 7A:
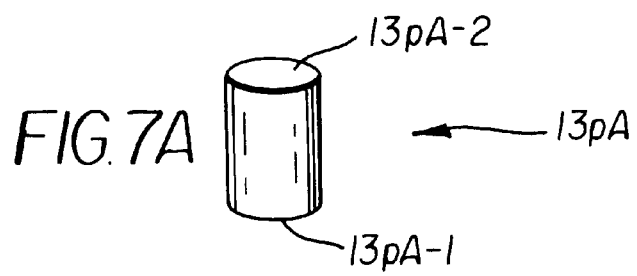

FIG. 7A depicts a cylindrical pellet 13pA of organic hole-transporting material having two co-planar major surfaces 13pA-1 and 13pA-2.

Figure 7B:
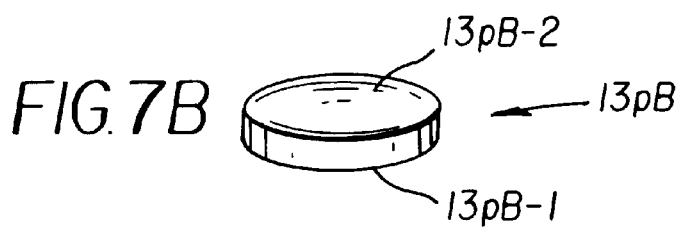

FIG. 7B shows a circular pellet 13pB having one planar major surface 13pB-1 and one opposing convex major surface 13pB-2.

Figure 7C:
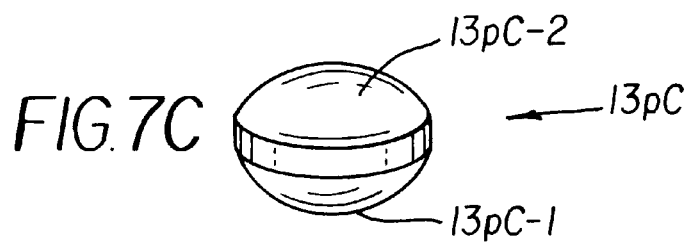

FIG. 7C shows a circular pellet 13pC having two convex major surfaces 13pC-1 and 13pC-2.

Figure 7D:
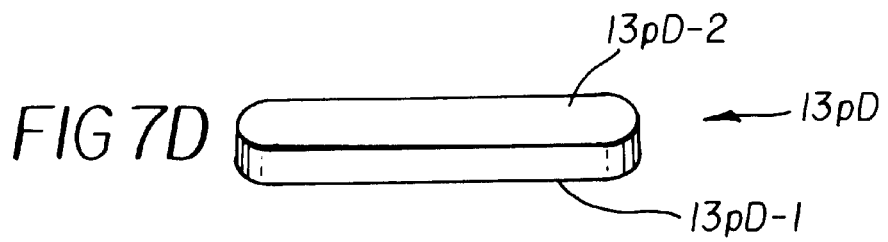

FIG. 7D shows an elongated pellet 13pD having two co-planar major surfaces 13pD-1 and 13pD-2.

Figure 7E:
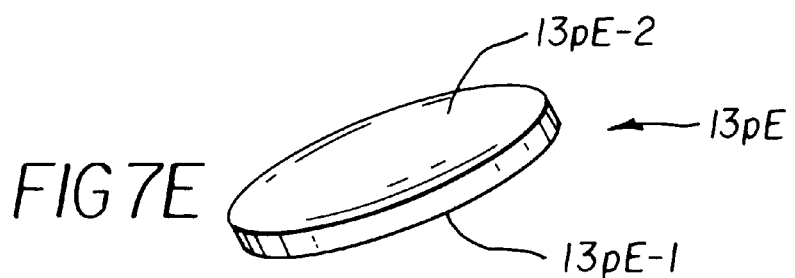

FIG. 7E depicts an elongated pellet 13pE having one planar major surface 13pE-1 and one opposing convex major surface 13pE-2.

A particular shape of a pellet is selected to be compatible with a particular vapor deposition source into which the pellet is to be placed. For example, a pellet or pellets 13pA (see FIG. 7A) may be used advantageously in a cylindrical vapor deposition source having a planar bottom surface. A pellet or pellets 13pE (see FIG. 7E) may be used advantageously in an elongated cylindrical tubular vapor deposition source, with a curvature of the convex major surface 13pE-2 approximately matching a radius of a cavity of such cylindrical tubular source.

Figure 8:
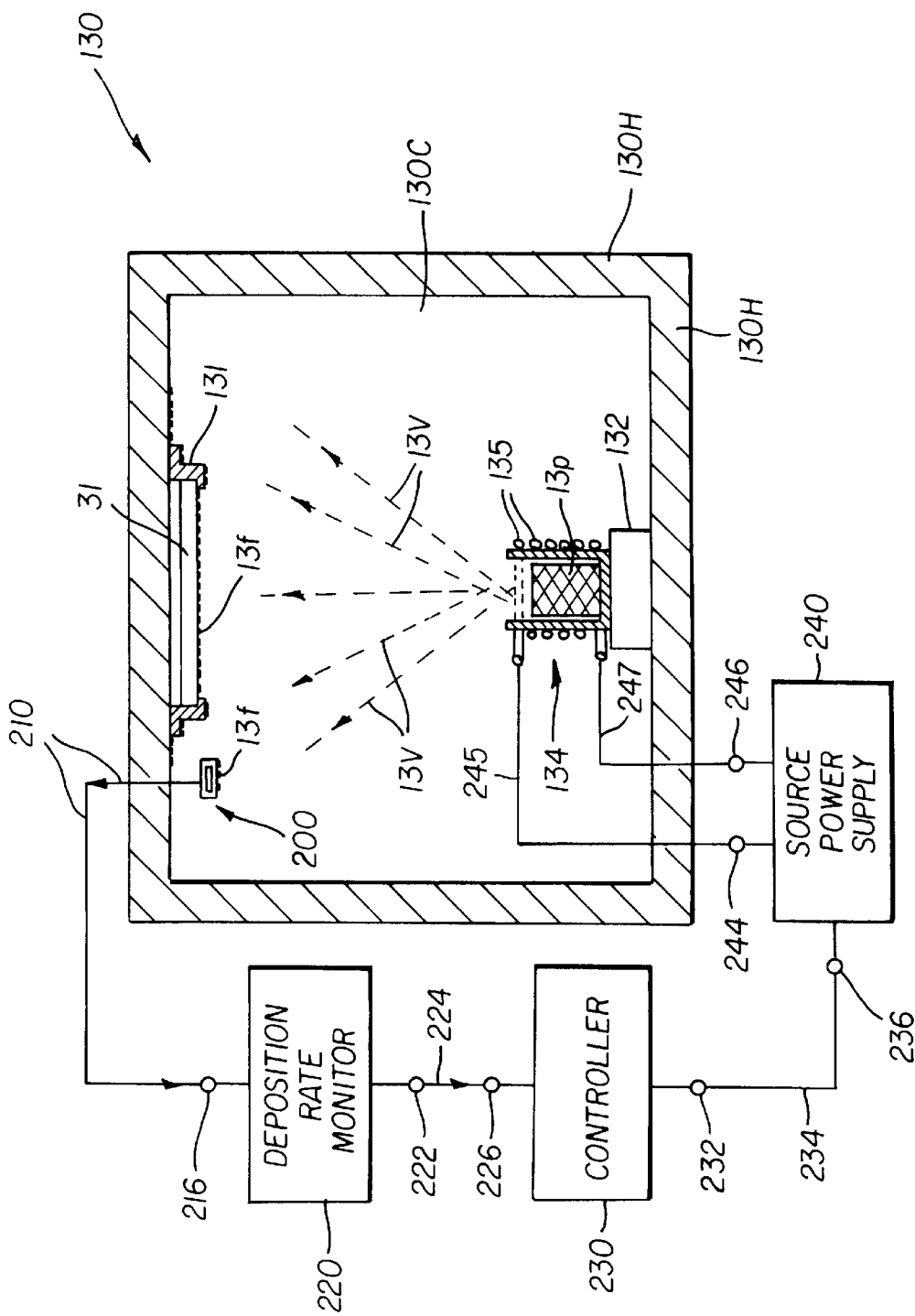
FIG. 8 is a schematic cross-sectional view of a physical vapor deposition station dedicated to forming an organic hole-transporting layer (HTL) on a substrate in the apparatus of FIG. 4 as indicated by section lines 8—8 in FIG. 4, and showing a solid pellet of organic hole-transporting material placed in a vapor deposition source, in accordance with an aspect of the present invention.

Turning to FIG. 8, a schematic cross section view of the organic HTL, ETL or EML physical vapor deposition station 130 is shown, taken along the section lines 8—8 of FIG. 4. A housing 130H defines a chamber 130C. A substrate 31 (see FIG. 1) is held in a holder 131 which can be constructed as a mask frame. A vapor deposition source 134 is positioned on a thermally insulative support 132, the source 134 filled with a pellet 13p of organic hole-transporting material, for example, a pellet 13pA of FIG. 5A. The source 134 is heated by heating elements 135 which are connected via leads 245 and 247 to corresponding output terminals 244 and 246 of a source power supply 240.

When a source temperature is sufficiently elevated, a portion of the pellet will sublime or vaporize and thus provide a deposition zone 13v of vapor of organic hole-transporting material, indicated schematically by dashed lines and arrows. Similarly, other organic layers such as ETL and EML can be formed by physical vapor deposition sequentially to form the OLED 30.

The substrate 31 as well as a conventional crystal mass-sensor 200 are positioned within the deposition zone, and each of these elements has an organic hole-transporting layer (HTL) being formed thereon as indicated by the designation 13f, shown in dashed outline.

As is well known in the art, the crystal mass-sensor 200 is connected via a lead 210 to an input terminal 216 of a deposition rate monitor 220. The sensor 200 is part of an oscillator circuit provided in the monitor 220 and the circuit oscillates at a frequency which is approximately inversely proportional to a mass-loading of the crystal such as by a mass-loading provided by the layer 13f being formed. The monitor 220 includes a differentiating circuit which generates a signal proportional to a rate of mass-loading, i.e. proportional to a rate of deposition of the layer 13f. This signal is indicated by the deposition rate monitor 220, and is provided at an output terminal 222 thereof. A lead 224 connects this signal to an input terminal 226 of a controller or amplifier 230 which provides an output signal at an output terminal 232. The latter output signal becomes an input signal to the source power supply 240 via lead 234 and input terminal 236.

Thus, if the vapor stream within the vapor deposition zone 13v is temporally stable, the mass build-up or growth of the layer 13f will proceed at a constant rate. The rate monitor 220 will provide a constant signal at output terminal 222, and the source power supply 240 will provide a constant current to the heating elements 135 of the source 134 via the leads 245 and 247, thereby maintaining the temporally stable vapor stream within the deposition zone. Under stable vapor deposition conditions, i.e. conditions of a constant deposition rate, a desired final thickness of an organic hole-transporting layer 33 or an organic emission layer 34 or an organic electron transport layer 35 (see FIG. 3) is achieved on the substrate and on the crystal mass-sensor 200 during a fixed deposition duration, at which time the vapor deposition is terminated by terminating the heating of the source 134, or by positioning a shutter (not shown) over the source.

While a relatively simple crucible source 134 is shown in FIG. 8 for illustrative purposes, it will be appreciated that numerous other source configurations can be effectively used to provide evaporated or sublimed vapors of organic materials within a deposition zone. Useful sources are extended or linear physical vapor deposition sources disclosed by commonly-assigned U.S. patent application Ser. No. 09/518,600, filed Mar. 3, 2000, the disclosure of which is herein incorporated by reference.

Particularly useful physical vapor deposition sources are elongated tubular sources disclosed in commonly-assigned U.S. patent application Ser. No. 09/843,489, filed Apr. 26, 2001, the disclosure of which is herein incorporated by reference.

A single crystal mass-sensor 200 is depicted in FIG. 8 to preserve clarity of the drawing. It will be appreciated that monitoring and controlling formation of organic layers by physical vapor deposition in making OLEDs can be achieved by one or several movable crystal mass-sensors as disclosed in commonly-assigned U.S. patent application Ser. No. 09/839,886, filed Apr. 20, 2001, the disclosure of which is herein incorporated by reference.

Other apparatus for controlling the thickness of an organic layer in making an OLED is disclosed in commonly-assigned U.S. patent application Ser. No. 09/839,885, filed Apr. 20, 2001, and commonly assigned, the disclosure of which is herein incorporated by reference.

Figure 9:
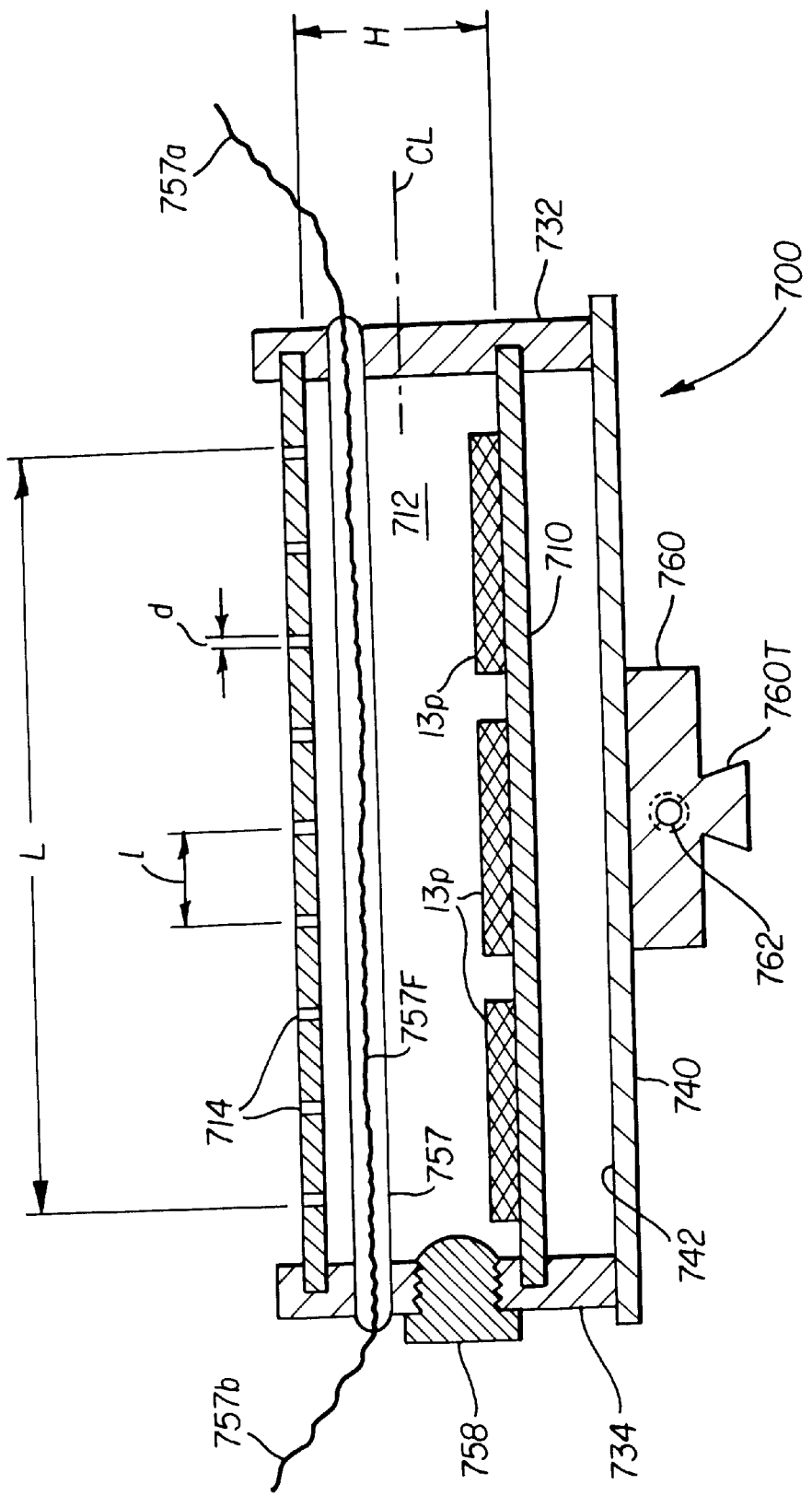
FIG. 9 is a partial cross-sectional view of a tubular vapor deposition source having a cavity in which three elongated solid pellets of organic hole-transporting material are placed.

Turning to FIG. 9, a schematic longitudinal sectional view of a cylindrical tubular physical vapor deposition source assembly 700 is shown. The assembly includes a tubular source 710 having a center line CL. The tubular source 710 is supported by thermally and electrically insulative end caps 732 and 34 which also support a heat shield 740 having a heat-reflective surface 742.

The tubular source 710, together with the heat shield supports and end caps 732 and 734, defines a cavity 712 in which three elongated solid pellets 13p of organic hole-transporting material have been placed through a removable cavity seal 758.

The tubular source 710 includes a plurality of openings 714 which extend into the cavity 712. The openings 714 are arranged in a line of a length dimension L which is at least three times greater than a height dimension H of the tubular source (for a cylindrical tubular source, H corresponds to the diameter of the cavity 712). The openings 714 have a diameter d, and a center-to-center spacing 1.

A glide bracket 760 is attached to the heat shield 740 and has a dovetail-shaped tongue 760T, and a threaded bore 762. The threaded bore 762 as would be engaged by a lead screw (not shown) so that the assembly 700 can be translated, moved, or scanned in a chamber with respect to a substrate disposed in such chamber, as described in greater detail in the above cited commonly-assigned U.S. patent application Ser. No. 09/843,489, filed Apr. 26, 2001, the disclosure of which is herein incorporated by reference.

When positioned in a chamber held at a reduced pressure of less than $10^{-3}$ Torr (for example, the chamber 130C of the HTL vapor deposition station 130 of FIG. 2), sublimation or evaporation of the organic hole-transporting material of the pellets 13p is actuated by providing electrical power to the filament 757F of the heat lamp 757 via lamp leads 757a and 757b. The heat lamp 757 is disposed inside the cavity 712 and is supported by the heat shield supports and end caps 732, 734 at a position upwardly from the center line CL in a direction towards the openings 714 of the tubular source 710. Vapor clouds thus formed in the cavity 712 exit the cavity through the openings 714.

The elongated pellets 13p can be shaped similarly to the pellet 13pE of FIG. 7E, so that a convex major surface is in contact with an inner surface of the cylindrical tubular source 710, and a planar major surface of the pellet faces upwardly toward the heat lamp 757.

While two examples of vapor deposition sources have been shown in the drawings (FIG. 8 and FIG. 9), it will be appreciated that the inventive method of handling organic materials by providing solid pellets, and by using such pellets for making OLEDs, is applicable in varied thermal physical vapor deposition sources and systems.

In FIGS. 6A–6F, FIGS. 7A–7E, FIG. 8, and FIG. 9, the methods of making and using solid pellets have been described with respect to organic hole-transporting materials and pellets 13p made therefrom. The methods of the invention also include making and using solid pellets of doped or undoped organic light-emitting materials and of doped or undoped organic electron-transporting materials to provide corresponding solid pellets for making a doped or undoped organic light-emitting layer and a doped or undoped organic electron-transporting layer, respectively, on a substrate, such as a layer 34 (EML) and a layer 35 (ETL) shown in FIG. 3 and made in respective vapor deposition stations 140 (EML) and 150 (ETL) of the OLED apparatus 100 of FIG. 4.

Figure 10:
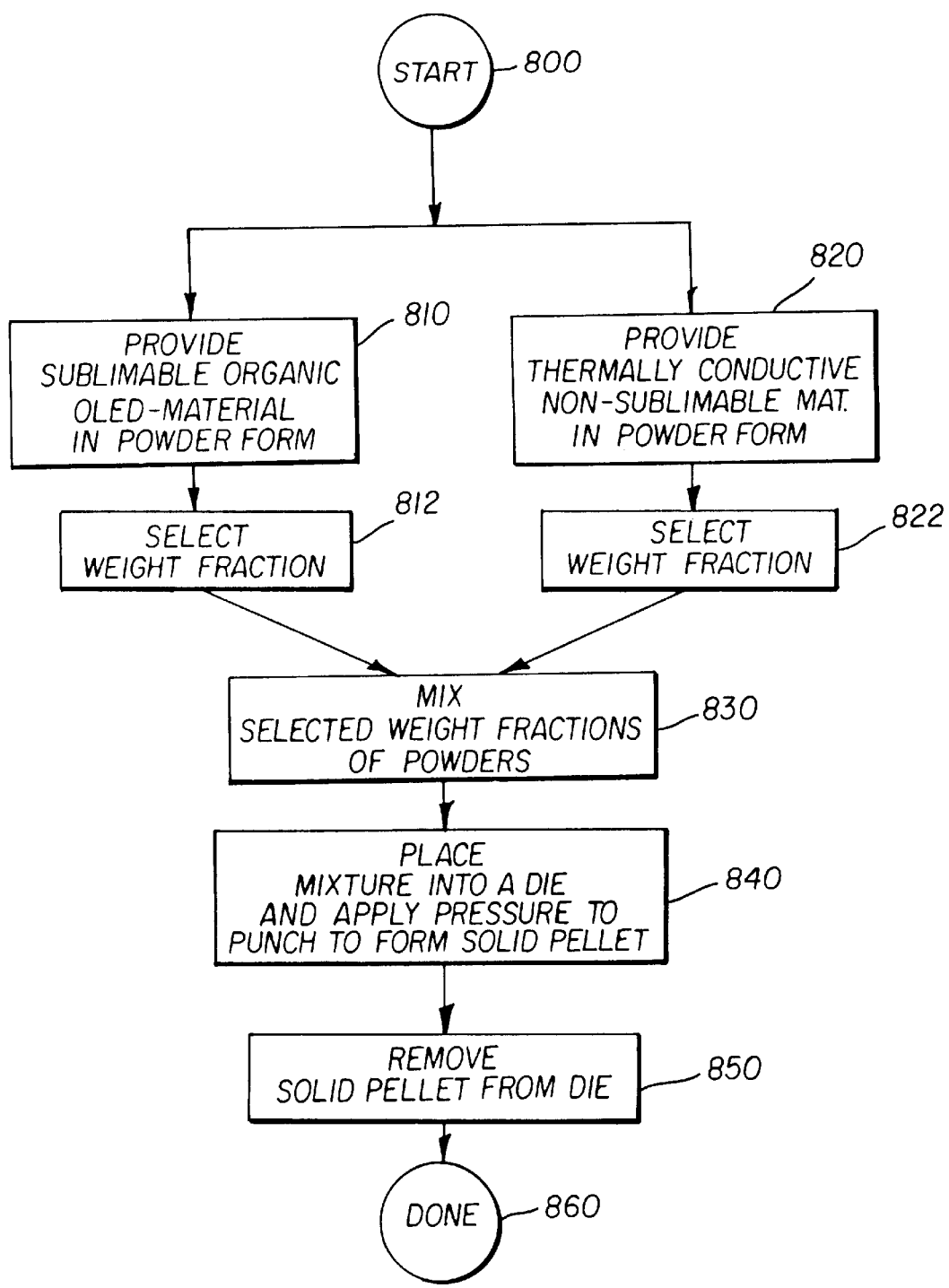
FIG. 10 is a process flow chart indicating the steps of producing a solid pellet from a mixture of a powder of a sublimable organic material and a powder of a thermally conductive and non-sublimable ceramic material, in accordance with another aspect of the present invention.

FIG. 10 is a process flow chart which indicates the steps of producing a solid pellet from a mixture of a powder of a sublimable OLED material and a powder of a non-sublimable and thermally conductive ceramic material.

The process starts at step 800. In a step 810, a sublimable OLED-material is provided in powder form. Sublimable organic materials include organic doped or undoped hole-transporting materials, organic emission (light emitting) materials, and doped or undoped organic electron-transporting materials.

In a step 812, a weight fraction (of a mixture to be formed) of the OLED-material powder is selected. A preferred weight fraction of the OLED-material powder is in a range from 50–99 percent.

In a step 820, a thermally conductive and non-sublimable ceramic material is provided in powder form. Preferred thermally conductive and non-sublimable ceramic materials include powders of aluminum nitride, titanium carbide, or tungsten carbide or other thermally conductive carbides or nitrides or mixtures thereof.

In a step 822, a weight fraction (of a mixture to be formed) of the thermally conductive and non-sublimable ceramic material powder is selected in a preferred range from 1.0–50 percent.

In a step 830, the selected weight fractions of the sublimable OLED-material powder and the thermally conductive and non-sublimable ceramic material powder are mixed or blended to provide a relatively uniform and homogenous mixture.

In a step 840, the mixture (or a portion of the mixture) is placed into a die, and sufficient pressure is applied to lower and upper punches to cause the mixture to consolidate into a solid pellet. The die can be heated to a temperature selected to be in a range from 50° C. to 300° C., without exceeding Tg of the organic materials, prior to or during applying sufficient pressure to the mixture in the punches.

In a step 850, the solid pellet is removed from the die. If the die was heated, the die is cooled to a temperature in a range from 50° C. to 20° C. prior to removing the solid pellet from the die. The process is now done, as indicated at 860.

The pellet or pellets can be placed into a physical vapor deposition source disposed in a chamber to make an organic layer on a substrate which will form part of an OLED.

Figure 11:
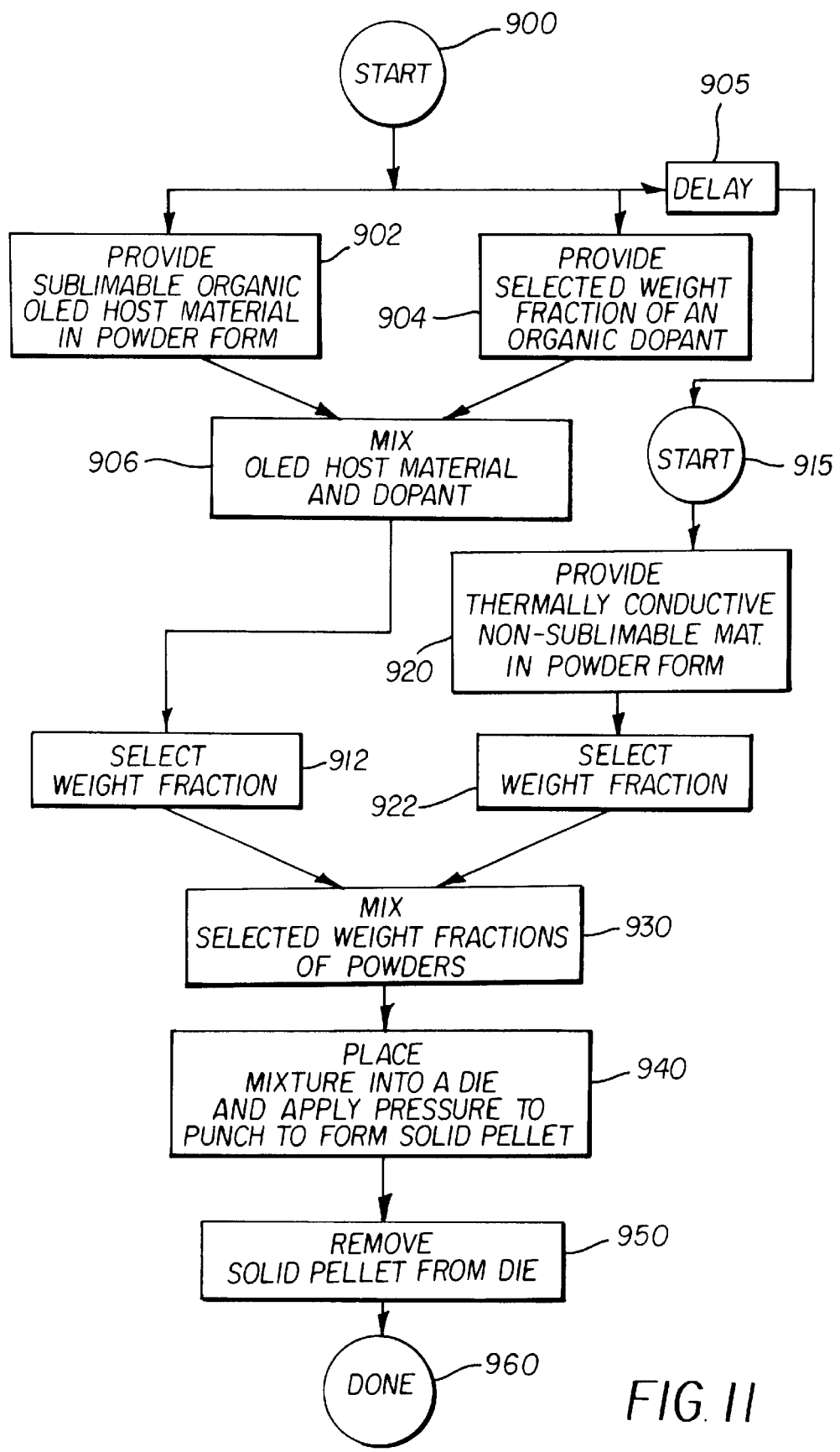
FIG. 11 is a process flow chart indicating the steps of producing a solid pellet by firstly mixing a powder of a sublimable OLED host material with a powder of a sublimable organic dopant material, and by secondly mixing the host-dopant mixture with a powder of a thermally conductive and non-sublimable ceramic material, in accordance with another aspect of the present invention.

FIG. 11 is a process flow chart which indicates the steps of a consolidating pellet by firstly mixing a powder of a sublimable OLED host organic material (Alq and NPB) with a powder of a sublimable organic dopant material, and by secondly mixing the host-dopant mixture with a powder of a thermally conductive and non-sublimable ceramic material.

The process starts at step 900. In a step 902, a sublimable OLED host organic material is provided in powder form. Sublimable OLED host organic materials include organic hole-transporting host materials, organic emission host materials, and organic electron-transporting host materials.

In a step 904, a selected weight fraction of a powder of a sublimable organic dopant material is provided. The selected weight fraction depends upon the OLED host material to be doped, the class of dopant or classes of dopants to be chosen, and a concentration of dopant(s) to be achieved in the host material so that a layer to be made on a substrate will have a predetermined dopant concentration in the host material.

In a step 906, the selected weight fraction of the organic dopant material is mixed or blended with the organic host material to provide a relatively homogenous first mixture of organic materials.

Following a delay 905 of the start command 900, a delayed start command 915 initiates providing a thermally conductive and non-sublimable ceramic material in powder form in a step 920. Preferred thermally conductive and non-sublimable ceramic materials include powders of aluminum nitride, titanium carbide, or tungsten carbide or other thermally conductive carbides or nitrides or mixtures thereof.

In a step 912, a weight fraction (of a second mixture to be formed) of the first host-dopant mixture is selected. A preferred weight fraction of this organic mixture is in a range from 50–99 percent.

In a step 922, a weight fraction (of the second mixture to be formed) of the thermally conductive and non-sublimable ceramic material powder is selected in a preferred range from 1–50 percent.

In a step 930, the selected weight fractions of the first organic host-dopant powder mixture and the thermally conductive and non-sublimable ceramic material powder are mixed or blended to provide a relatively uniform second mixture comprising a selected portion of the first mixture and the thermally conductive and non-sublimable ceramic material powder.

In a step 940, the second mixture (or a portion of the second mixture) is placed into a die, and sufficient pressure is applied to the second mixture in the punch to cause the second mixture to consolidate into a solid pellet.

The die can be heated to a temperature selected to be in a range from 20° C. to 300° C. prior to or during applying sufficient pressure to the second mixture in the punch.

In a step 950, the solid pellet is removed from the die. If the die was heated, the die is cooled to a temperature in a range from 80° C. to 20° C. prior to removing the solid pellet from the die. The process is now done, as indicated at 960.

The pellet or pellets can be placed into a physical vapor deposition source disposed in a chamber to make a doped organic layer on a substrate which will form part of an organic light-emitting device (OLED).

A doped organic hole-transporting layer or sub-layer and a doped organic electron-transporting layer or sub-layer can provide enhanced operational stability of light emission of an OLED, and a doped organic emission layer can provide enhanced operational stability of light emission of an OLED as well as enhanced luminous efficiency of light emission within a region of the visible spectrum. Doped layers or sublayers also provide OLEDs which can be operated at reduced drive voltage levels.

WORKING EXAMPLES

Example 1

Organic emission material Alq powder was intimately mixed in a ball mill in proportions of 5 and 10% by weight with thermally conductive AlN ceramic powder. The powder mixture was then solid in a hydraulic press in a die at a pressure range of 3,000 psi to 15,000 psi and die temperature of between 60 and 300° C. Solid pellets having good physical integrity and density higher than 90% of theoretical density were then used as evaporation sources to deposit emission layer for OLED devices. Pellets solid at pressures around between 3,000 psi and 12,000 psi, and those preferably solid around between 5,000 and 10,000 psi and the temperature range of between 50° C. and 120° C. yielded the best device performance comparable to those control samples made from powder Alq material.

Example 2

Organic hole-transport host material NPB powder was intimately mixed in a ball mill in proportions of 5 and 10% by weight with thermally conductive AlN ceramic powder. The powder mixture was then solid in a hydraulic press in a die at a pressure range of 2,000 psi to 15,000 psi and die temperature of between 60 and 200° C. Solid pellets having good physical integrity and density higher than 90% of theoretical density were then used as evaporation sources to deposit hole-transport layer for OLED devices. Pellets solid at pressures around between 2,000 psi and 10,000 psi, and those preferably solid around between 3,000 and 8,000 psi and the temperature range of between 50° C. and 100° C. yielded the best device performance comparable to those control samples made from powder NPB material.

Comparative Example

Organic Alq and NPB powders were mixed with 5 to 25% by weight of thermally conductive metals powders of copper and aluminum. Organic emission material Alq and organic hole-transport material NPB powder each was intimately mixed in a ball mill in proportions of 5 and 25% by weight with thermally conductive Al and Cu metal powder. The powder mixture was then solid in a hydraulic press in a die at a pressure range of 2,000 psi to 15,000 psi and die temperature of between 60 and 200° C. Solid pellets having good physical integrity and density higher than 90% of theoretical density were then used as evaporation sources to deposit emission layer and hole-transport layer for OLED devices. The devices showed poor electro-optical performance with reference to the control devices made from respective powder sources. It appeared that Cu and Al metal species contaminated the OLED devices.

One or more organic host materials in powder form and one or more organic dopant materials in powder form can be mixed or blended to provide a first mixture of organic materials which is then mixed or blended with the thermally conductive and non-sublimable ceramic material powder to provide a second mixture from which a solid pellet is formed.

The invention has been described in detail with particular reference to certain preferred embodiments thereof, but it will be understood that variations and modifications can be effected within the spirit and scope of the invention.

| PARTS LIST | |
|---|---|
| 10 | OLED with simple substrate |
| 11 | substrate |
| 12 | anode |
| 13 | organic hole-transporting layer (HTL) |
| 13a | organic hole-transporting material powder or flakes |
| 13b | level of organic hole-transporting material powder |
| 13p | pellet of organic hole-transporting material |
| 13v | deposition zone of vapor of organic hole-transporting material |
| 13f | organic hole-transporting layer being formed |
| 13pA | circular or cylindrical pellet of organic hole-transporting material |
| 13pA-1 | planar major surface |
| 13pA-2 | planar major surface |
| 13pB | circular pellet of organic hole-transporting material |
| 13pB-1 | planar major surface |
| 13pB-2 | convex major surface |
| 13pC | circular pellet of organic hole-transporting material |
| 13pC-1 | convex major surface |

-continued

PARTS LIST

| | | |
|---|---|---|
| 13pC-2 | convex major surface |
| 13pD | elongated pellet of organic hole-transporting material |
| 13pD-1 | planar major surface |
| 13pD-2 | planar major surface |
| 13pE | elongated pellet of organic hole-transporting material |
| 13pE-1 | planar major surface |
| 13pE-2 | convex major surface |
| 14 | organic emission layer (EML) |
| 15 | cathode |
| 20 | OLED with multilayer substrate |
| 21 | substrate |
| 22 | anode |
| 23 | organic hole-injection layer (HEL) |
| 24 | organic hole-transport layer (HTL) |
| 25 | organic emission layer (EML) |
| 26 | organic electron-transport layer |
| 27 | cathode |
| 30 | OLED |
| 31 | substrate |
| 32 | anode( first electrode) |
| 33 | organic hole-transport layer (HTL) |
| 34 | organic emission layer (EML) |
| 35 | organic electron-transport layer (ETL) |
| 36 | cathode (second electrode) |
| 38 | encapsulation or cover |
| 100 | system |
| 102 | buffer hub |
| 103 | unload station |
| 104 | transfer hub |
| 105 | connector port |
| 106 | vacuum pump |
| 107 | pumping port |
| 108 | pressure gauge |
| 110 | load station |
| 110C | chamber |
| 110H | housing |
| 111 | carrier (for substrates) |
| 130 | vapor deposition station (organic HTL) |
| 130C | chamber |
| 130H | housing |
| 131 | holder and/or mask frame |
| 132 | thermally insulative support |
| 134 | source |
| 135 | heating element(s) |
| 140 | vapor deposition station (organic LEL) |
| 150 | vapor deposition station (organic ETL) |
| 160 | vapor deposition station (second electrodes) |
| 170 | storage station |
| 180 | encapsulation station |
| 200 | crystal mass-sensor |
| 210 | lead |
| 216 | input terminal |
| 220 | deposition rate monitor |
| 222 | output terminal |
| 224 | lead |
| 226 | input terminal |
| 230 | controller or amplifier |
| 232 | output terminal |
| 234 | lead |
| 236 | input terminal |
| 240 | source (heating) power supply |
| 244 | output terminal |
| 245 | lead |
| 246 | output terminal |
| 247 | lead |
| 500 | uniaxial press |
| 512 | fixed platform |
| 514 | movable platform |
| 516 | posts |
| 520 | die |
| 521 | polished interior surface |
| 522 | lower punch |
| 523 | polished surface |
| 524 | upper punch |
| 525 | polished surface |
| 526 | die cavity |
| 530 | heating coils |

-continued

PARTS LIST

| | | |
|---|---|---|
| 540 | cooling coil |
| 550 | pellet plunger |
| 560 | compliant container |
| 700 | cylindrical physical vapor deposition source assembly |
| 710 | tubular source |
| 712 | cavity |
| 714 | openings (extending into cavity) |
| 732 | heat shield support and end cap |
| 734 | heat shield support and end cap |
| 740 | heat shield |
| 742 | heat-reflective surface |
| 757 | heat lamp |
| 757F | filament |
| 757a | lamp lead |
| 757b | lamp lead |
| 758 | cavity seal |
| 760 | glide bracket |
| 760T | tongue |
| 762 | threaded bore |
| 800 | start of process |
| 810 | providing sublimable OLED-material in powder form |
| 812 | selecting weight fraction of OLED-material powder |
| 820 | providing thermally conductive and non-sublimable ceramic material in powder form |
| 822 | selecting weight fraction of thermally conductive and non-sublimable ceramic material powder |
| 830 | mixing selected weight fractions of powders to provide a mixture |
| 840 | placing mixture into a die and applying pressure to the punch to form a solid pellet |
| 850 | removing the solid pellet from the die |
| 860 | completion of process |
| 900 | start of process |
| 902 | providing sublimable OLED host material in powder form |
| 904 | providing selected weight fraction of sublimable organic dopant material in powder form |
| 905 | delaying start command 900 |
| 906 | mixing OLED host material and organic dopant material to provide a first mixture |
| 912 | selecting a weight fraction of the first mixture |
| 915 | delayed start |
| 920 | providing thermally conductive and non-sublimable ceramic material in powder form |
| 922 | selecting weight of thermally conductive and non-sublimable ceramic material powder |
| 930 | mixing selected weight fractions of powders to provide a second mixture |
| 940 | placing second mixture into a die and applying pressure to the punch to form a solid pellet |
| 950 | removing the solid pellet from the die |
| 960 | completion of process |
| CL | center line of a tubular source |
| d | diameter of openings |
| H | height dimension of cavity |
| L | length dimension of a line of openings |
| l | center-to-center spacing between openings |

What is claimed is:

1. A method of making an organic layer from an organic material on a substrate which will form part of an organic light-emitting device, comprising the steps of:

(a) providing a sublimable organic material in a powder form;

(b) providing a thermally conductive and non-sublimable ceramic material in a powder form;

(c) forming a mixture of the sublimable organic material powder and thermally conductive and non-sublimable ceramic material powder;

(d) placing such mixture into a die and using two opposing punches to apply sufficient pressure to the mixture;

(e) applying heat to the die during or prior to applying pressure by the opposing punches to aid in causing the mixture of powders to consolidate into a solid pellet; and (f) removing the pellet from the die.

2. The method of using the pellet formed in claim 1 for making a layer of organic material for an OLED device comprising the steps of:

(a) placing the pellet into a physical vapor deposition source disposed in a chamber;

(b) positioning the substrate in the chamber and in a spaced relationship with respect to the source;

(c) evacuating the chamber to a reduced pressure; and (d) applying heat to the source to cause at least a portion of the organic material in the pellet to sublime while the thermally conductive ceramic material remains unsublimed to provide a vapor of the organic material which forms the organic layer on the substrate.

3. The method of claim 2 wherein step (a) includes placing more than one pellet into the physical vapor deposition source.

4. The method of claim 1 wherein step (a) includes providing organic hole-transporting material, organic emission material, or organic electron-transporting material.

5. The method of claim 4, wherein step (a) further includes providing at least one organic hole-transporting host material and at least one organic dopant material therefor, at least one organic emission host material and at least one organic dopant material therefor, or at least one organic electron-transporting host material and at least one organic dopant material therefor.

6. The method of claim 1 wherein the thermally conductive ceramic material is selected from the group consisting of aluminum nitride, tungsten carbide, and titanium carbide, or mixtures thereof.

7. The method of claim 6 wherein step (c) includes selecting a portion of the sublimable organic material powder in a range from 50 to 99 weight percent and selecting a portion of the thermally conductive and non-sublimable ceramic material powder in a range from 1 to 50 weight percent.

8. The method of claim 1 wherein step f) includes the temperatures is in a range of 50 to 200° C.

9. The method of claim 1 wherein step (d) includes the applied pressure is in a range of 2,000 to 15,000 psi.

10. A method of making solid pellets of sublimable organic material adaptable for making an organic layer on a substrate which will form part of an organic light-emitting device, comprising the steps of:

(a) providing at least one sublimable organic host material in a powder form;

(b) providing at least one sublimable organic dopant material in a powder form and as a selected weight fraction of the organic host material;

(c) forming a first mixture of the at least one organic host material and the at least one organic dopant material;

(d) providing a thermally conductive and non-sublimable ceramic material in a powder form;

(e) forming a second mixture of selected portions of the first mixture and the thermally conductive and non-sublimable ceramic material powder;

(f) placing such mixture into a die and using a two opposing punches to apply sufficient pressure to the mixture;

(g) applying heat to the die during or prior to applying pressure by the opposing punches to aid in causing the second mixture of powders to consolidate into a solid pellet; and (h) removing the pellet from the die.

11. The method of claim 10 wherein step (a) includes providing at least one organic hole-transporting host material, at least one organic emission host material, or at least one organic electron-transporting host material.

12. The method of claim 10 wherein step (d) includes providing a ceramic material selected from the group consisting of aluminum nitride, tungsten carbide, and titanium carbide or mixtures thereof.

13. The method of claim 10 wherein step (e) includes selecting a portion of the first mixture in a range from 50 to 99 weight percent and selecting a portion of the thermally conductive and non-sublimable ceramic material powder in a range from 1.0 to 50 weight percent.

14. The method of claim 10 wherein step (f) includes placing the second mixture into a die having at least one concave major surface to provide the solid pellet with at least one corresponding convex major surface.

15. The method of claim 10 wherein step (g) further includes selecting a temperature of the die in a range from 50° C. to 300° C. which is below the Tg of the organic materials in the second mixture prior to or during applying sufficient pressure to the second mixture in the punch.

16. The method of claim 15 wherein step (g) further includes reducing the temperature of the die to be in a range from 20° C. to 80° C. prior to removing the pellet from the die.

17. The method of claim 15 wherein the temperature is in a range from 50 and 200° C.

18. The method of claim 15 wherein the applied pressure is in a range of 2,000 to 15,000 psi.

19. A method of making an organic layer from an organic material on a substrate which will form part of an organic light-emitting device, comprising the steps of:

(a) providing at least one sublimable organic host material in a powder form;

(b) providing at least one sublimable organic dopant material in a powder form and as a selected weight fraction of the organic host material;

(c) forming a first mixture of the at least one organic host material and the at least one organic dopant material;

(d) providing a thermally conductive and non-sublimable ceramic material in a powder form;

(e) forming a second mixture of selected portions of the first mixture and the thermally conductive and non-sublimable ceramic material powder;

(f) placing such second mixture into a die and applying sufficient pressure using two opposing punches to the second mixture in the die;

(g) applying heat to the die during or prior to applying pressure to by the opposing punches to aid in causing the second mixture of powders in the die to consolidate into a solid pellet;

(h) removing the pellet from the die;

(i) placing the pellet into a physical vapor deposition source disposed in a chamber;

(j) positioning the substrate in the chamber and in a spaced relationship with respect to the source;

(k) evacuating the chamber to a reduced pressure; and (l) applying heat to the source to cause a portion of the pellet to sublime to provide a vapor of the first mixture of organic materials from which the organic layer is made on the substrate.

20. The method of claim 19 wherein step (a) further includes providing at least one organic hole-transporting host material, at least one organic light-emitting host material, or at least one organic electron-transporting host material.

21. The method of claim 19 wherein step (b) further includes providing at least one organic dopant material selected as a dopant for the at least one organic hole-transporting host material, at least one organic dopant material selected as a dopant for the at least one organic light-emitting host material, or at least one organic dopant material selected as a dopant for the at least one organic electron-transporting host material.

22. The method of claim 19 wherein step (d) includes providing a ceramic material selected from the group consisting of aluminum nitride, tungsten carbide and titanium carbide, or mixtures thereof.

23. The method of claim 19 wherein step (i) includes placing more than one pellet into the physical vapor deposition source.

24. The method of claim 19 wherein the temperature is in a range from 50 and 200° C.

25. The method of claim 19 wherein the applied pressure is in a range of 2,000 to 15,000 psi.

* * * * *